United States Patent [19]
Nakamura

[11] Patent Number: 5,894,213
[45] Date of Patent: Apr. 13, 1999

[54] SEMICONDUCTOR INTEGRATED CIRCUIT HAVING A PLURALITY OF FLIP-FLOPS

[75] Inventor: Kyotaro Nakamura, Tokyo, Japan

[73] Assignee: Oki Electric Industry Co., Ltd., Tokyo, Japan

[21] Appl. No.: 08/907,022

[22] Filed: Aug. 6, 1997

[30] Foreign Application Priority Data

Oct. 7, 1996 [JP] Japan .................................. 8-266364

[51] Int. Cl.⁶ .................................................. G05B 1/007
[52] U.S. Cl. ............................... 340/146.2; 327/199
[58] Field of Search ........................... 327/199, 77, 162, 327/2, 3, 7, 141; 340/146.2; 365/189.07, 201; 371/22.1, 22.31, 22.36, 27, 7; 377/54

[56] References Cited

U.S. PATENT DOCUMENTS

| | | | |
|---|---|---|---|
| 4,064,488 | 12/1977 | Chapman | 340/171 R |
| 4,246,569 | 1/1981 | Baldwin et al. | 340/146.2 |
| 5,245,311 | 9/1993 | Honna | 340/146.2 |
| 5,398,270 | 3/1995 | Cho et al. | 377/39 |
| 5,578,938 | 11/1996 | Kazami | 326/16 |

FOREIGN PATENT DOCUMENTS 61-217839  9/1996  Japan .................................. G06F 11/22

*Primary Examiner*—Timothy P. Callahan
*Assistant Examiner*—Hai L. Nguyen
*Attorney, Agent, or Firm*—Jones & Volentine, L.L.P.

[57] ABSTRACT

A semiconductor integrated circuit is activated to allow a plurality of FFs 1 incorporated therein to latch data therein. Thereafter, the semiconductor integrated circuit is switched to test mode connections. Upon the test mode connections, for example, FFs are connected in plural stages to form scan paths 101 through 10m and scan paths 111 through 11m paired up therewith. When expected values corresponding to data latched in the scan paths 101 through 10m of the other of the pair are written into the scan paths 111 through 11m of one of the pair, respectively and they are shift-operated, exclusive OR circuits 121 through 12m successively compare the latched data and the expected values. Further, an OR circuit 13 successively outputs data indicative of whether or not the semiconductor integrated circuit works normally. Insofar as the latched data and the expected values coincide with each other, the OR circuit 13 outputs "0".

10 Claims, 8 Drawing Sheets

| Sc10, Sc11 | $10_1 \sim 10_m$ | $11_1 \sim 11_m$ |
|---|---|---|
| "0", "0" | disable | disable |
| "0", "1" | disable | enable |
| "1", "0" | enable | disable |
| "1", "1" | enable | enable |

FIG.8

SEMICONDUCTOR INTEGRATED CIRCUIT HAVING A PLURALITY OF FLIP-FLOPS

BACKGROUND OF THE INVENTION

1. Field of the Invention

This invention relates to a semiconductor integrated circuit capable of determining from latched states of a plurality of flip-flops in the semiconductor integrated circuit, whether or not the semiconductor integrated circuit works normally.

2. Description of the Related Art

As a technique in such a field, one described in the following reference, for example, has heretofore been known:

Reference: Japanese Patent Application Laid-Open No. 61-217839

A scan test is carried out to determine whether or not a semiconductor integrated circuit works normally. In one of conventional scan test methods, all the flip-flops provided inside the semiconductor integrated circuit are serially connected to one another to form a single scan path. Data stored in the flip-flops constituting the scan path are shifted so as to be outputted to the outside. Whether or not the semiconductor integrated circuit operates normally, is determined by checking the output data against expected value prepared for the data in advance. This method has a problem in that clocks are required by at least the number of flip-flops upon its determination so that the time required to carry out the scan test is prolonged. In order to solve the problem, a plurality of scan paths in which the flip-flops are serially connected to one another substantially by the same numbers, are formed in the above-described reference. All the outputs from the rearmost ones of the plurality of scan paths are exclusive-ORed. The results of the exclusive OR are checked against the predetermined expected values so as to make a decision as to the operation of the semiconductor integrated circuit.

In such a semiconductor integrated circuit, the number of clocks for shifting the data stored in the respective flip-flops to the outside can be reduced. However, since all the outputs of the rearmost ones of the plurality of scan paths are exclusive-ORed, the expected values corresponding to the exclusive OR become complex.

SUMMARY OF THE INVENTION

With the foregoing in view, it is therefore an object of the present invention to shorten the time required to process a scan test on a semiconductor integrated circuit having a plurality of flip-flops.

It is another object of the present invention to permit easy confirmation of a failure in a semiconductor integrated circuit.

Thus, the present invention provides a semiconductor integrated circuit having a plurality of flip-flops for respectively storing data transferred from corresponding logic circuits, which comprises a plurality of data terminals for inputting data. The plurality of flip-flops comprise a first flip-flop group responsive to a first control signal and a second flip-flop group responsive to a second control signal. Each of the flip-flops constituting the first flip-flop group includes an output terminal, a first input terminal for receiving a signal from a corresponding one of the logic circuits, a second input terminal electrically connected to the output terminal of each of other flip-flops constituting the first flip-flop group, or a corresponding one of the data terminals, a selection circuit for selectively outputting a signal received at either one of the first and second input terminals in response to the first control signal, and a first latch circuit for latching the output of the selection circuit in response to a first clock signal and outputting the same from the output terminal. The respective flip-flops of the first flip-flop group constitute a plurality of first scan path circuits each of which is responsive to the first control signal and which has a predetermined number of the flip-flops connected in series and successively transfers the data inputted from one of the data terminals to the next-stage flip-flops in response to the first clock signal. Further, each of the flip-flops constituting the second flip-flop group includes a third input terminal for receiving a signal from a corresponding one of the logic circuits, a fourth input terminal electrically connected to the output terminal of each of other flip-flops constituting the second flip-flop group, or a corresponding one of the data terminals, a selection circuit for selecting either one of the third and fourth input terminals in response to the second control signal and outputting a signal at the selected input terminal therefrom, and a second latch circuit for latching the output of the selection circuit in response to a second clock signal and outputting the same from the output terminal. The respective flip-flops of the second flip-flop group constitute a plurality of second scan path circuits each of which is responsive to the second control signal and which has a predetermined number of the flip-flops connected in series and successively transfers the data inputted from one of the data terminals to the next-stage flip-flops in response to the second clock signal. Further, the semiconductor integrated circuit has a plurality of coincidence detection circuits for respectively detecting coincidences of outputs of the first scan path circuits and outputs of the second scan path circuits respectively corresponding to the first scan path circuits, and a logic circuit for outputting coincidence detection information corresponding to the results outputted from the plurality of coincidence detection circuits. Thus, the present invention can achieve the above objects.

Further, the present invention provides a semiconductor integrated circuit having a plurality of flip-flops for respectively storing data transferred from corresponding logic circuits, which comprises a plurality of data terminals for inputting data. The plurality of flip-flops comprise a first flip-flop group responsive to a first control signal and a second flip-flop group responsive to a second control signal. Each of the flip-flops constituting the first flip-flop group includes an output terminal, a first input terminal for receiving a signal from a corresponding one of the logic circuits, a second input terminal electrically connected to the output terminal of each of other flip-flops constituting the first flip-flop group, or a corresponding one of the data terminals, a selection circuit for selectively outputting a signal received at either one of the first and second input terminals in response to the first control signal, and a first latch circuit for latching the output of the selection circuit in response to a first clock signal and outputting the same from the output terminal. Further, the respective flip-flops of the first flip-flop group constitute a plurality of first scan path circuits each of which is responsive to the first control signal and which has a predetermined number of the flip-flops connected in series and successively transfers the data inputted from one of the data terminals to the next-stage flip-flops in response to the first clock signal. Moreover, each of the flip-flops constituting the second flip-flop group includes a third input terminal for receiving a signal from a corresponding one of the logic circuits, a fourth input terminal electrically connected to the output terminal of each of other flip-flops constituting the second flip-flop group, or a corresponding one of the data terminals, a selection circuit for selecting either one of the third and fourth input terminals in response to the second control signal and outputting a signal at the selected input terminal therefrom, and a second latch circuit for latching the output of the selection circuit in response to a second clock signal and outputting the same from the output terminal. The respective flip-flops of the second flip-flop group constitute a plurality of second scan path circuits each of which is responsive to the second control signal and which has a predetermined number of the flip-flops connected in series and successively transfers the data inputted from one of the data terminals to the next-stage flip-flops in response to the second clock signal. Further, the semiconductor integrated circuit has a plurality of coincidence detection circuits for respectively detecting coincidences of respective one outputs of the flip-flops constituting the first scan path circuits and respective one outputs of the flip-flops constituting the second scan path circuits, said respective one outputs respectively corresponding to the respective one outputs of the flip-flops constituting the first scan path circuits, a plurality of first logic circuits for outputting first coincidence detection information corresponding to the results outputted from the plurality of coincidence detection circuits, and a second logic circuit for outputting second coincidence detection information corresponding to the results outputted from the plurality of first logic circuits. Even with the above construction, the present invention can achieve the above objects.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 8 is a diagram depicting signals Sc10 and Sc11 shown in FIG. 1;

DETAILED DESCRIPTION OF THE PREFERRED EMBODIMENTS

Preferred embodiments of the present invention will hereinafter be described in detail with reference to the accompanying drawings.

First Embodiment

Figure 1:
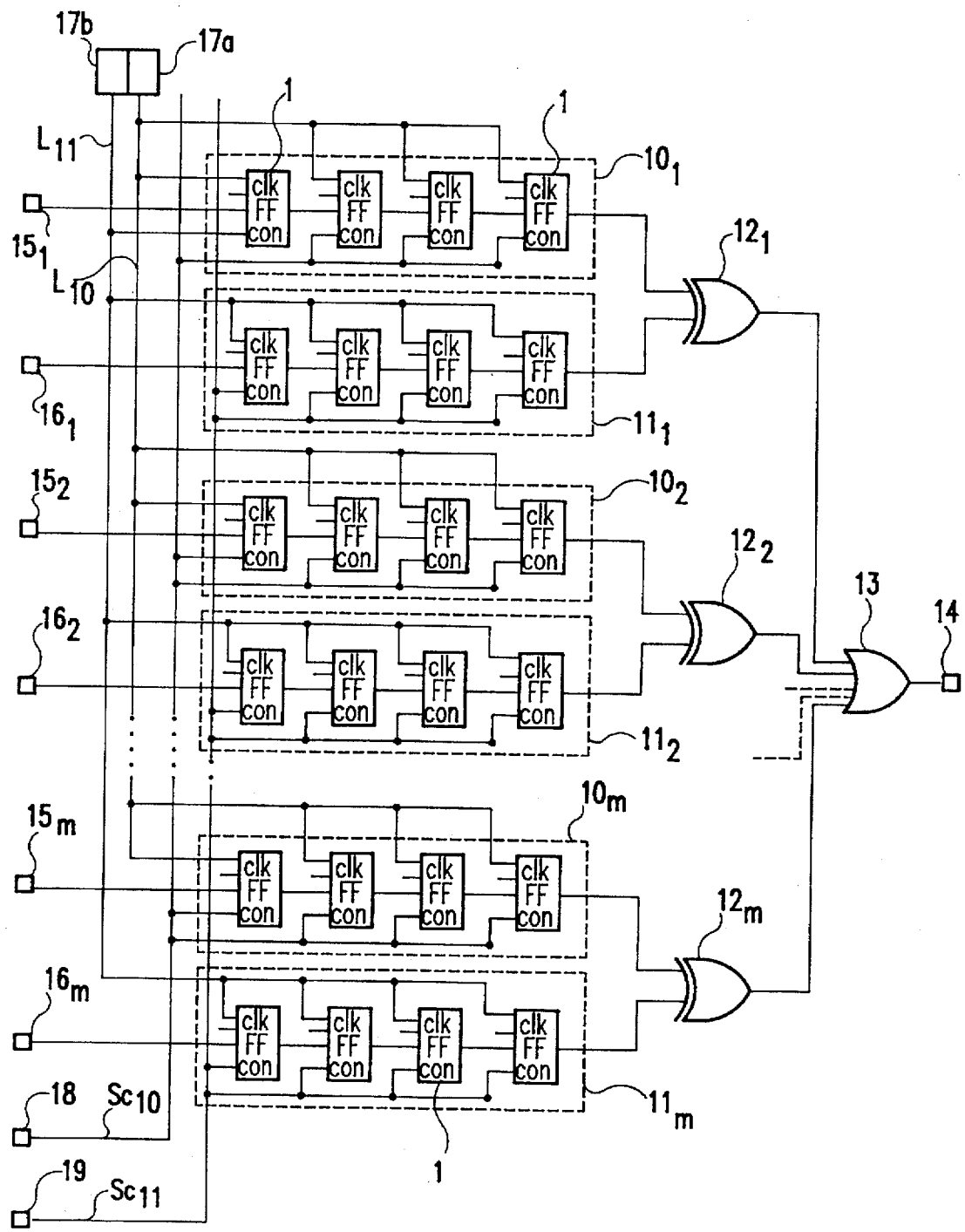
FIG. 1 is a circuit diagram showing test mode connections to flip-flops employed in a scan test method, of a semiconductor integrated circuit according to a first embodiment of the present invention.

FIG. 1 is a circuit diagram showing test mode connections to flip-flops employed in a scan test method, of a semiconductor integrated circuit according to a first embodiment of the present invention.

The semiconductor integrated circuit has a plurality of flip-flops (hereinafter called "FFs") 1. These FFs 1 are connected so as to correspond to a normal mode in order to perform the original operation as an integrated circuit upon a normal mode operation. In a test mode for testing the semiconductor integrated circuit, electrical connections corresponding to the test mode are illustrated in FIG. 1. The FFs 1 can be set to the connections corresponding to the test mode.

Upon the electrical connections between the FFs in the test mode, FFs 1 are series-connected to each other in four stages, for example, to form m (m: arbitrary positive integer) first can paths 101 through 10m, and FFs 1 are series-connected to one another in four stages to form m second scan paths 111 through 11m. The respective scan paths 101 through 10m and respective scan paths 111 through 11m form m pairs of scan path pairs. Although the semiconductor integrated circuit will be described later, it selects only any one of the respective scan paths 101 through 10m and the respective scan paths 111 through 11m provided in pairs and causes the selected one to perform a shift operation as a shift register to thereby allow the one to store expected values of FFs 1 in the other scan path. Both of the respective scan paths 101 through 10m and the respective scan paths 111 through 11m can be also activated as shift registers.

An exclusive OR circuit 121 corresponding to a comparing means provided so as to correspond to the scan path pair is electrically connected to the FFs 1 at output stages of the paired scan paths 101 and 111. Similarly, exclusive OR circuits 122 through 12m corresponding to comparing means provided so as to correspond to the scan path pairs are electrically connected to the FFs 1 at output stages of the paired scan paths 102 through 10m and scan paths 112 through 11m, respectively. An OR circuit 13 corresponding to a logical means is electrically connected to the output sides of these exclusive OR circuits 121 through 12m. The output side of the OR circuit 13 is electrically connected to an output terminal 14.

The FFs corresponding to first or initial stages of the respective scan paths 101 through 10m are electrically connected to a plurality of input terminals 151 through 15m, respectively. Further, the FFs corresponding to first stages of the respective scan paths 111 through 11m are electrically connected to a plurality of terminals 161 through 16m, respectively. A clock signal transmission line L10 is electrically connected to clock terminals CLK of the FFs 1 consisting of four stages of the respective scan paths 101 through 10m. The clock signal transmission line L10 is electrically connected to a clock selection circuit 17a. A control signal Sc10 transmitted through a terminal 18 is commonly supplied to control terminals CON of the FFs 1 consisting of the four stages of the respective scan paths 10 1 through 10m.

On the other hand, a clock signal transmission line L11 is electrically commonly connected to clock terminals CLK of the FFs 1 consisting of four stages of the respective scan paths 11 1 through 11m. The clock signal transmission line L11 is electrically connected to a clock selection circuit 17b. A control signal Sc11 transmitted through a terminal 19 is commonly supplied to control terminals CON of the FFs 1 consisting of the four stages of the respective scan paths 11 1 through 11m.

The connections corresponding to the test mode are those set for checking or detecting latched states of the respective FFs 1 activated in the normal mode at some point in time. Namely, switching to the connections corresponding to the test mode is done by the control signals Sc10 and Sc11. In order to implement this switching, peripheral circuits of the flip-flops constituting each scan path employed in the semiconductor integrated circuit take configurations shown below, for example.

Figure 2:
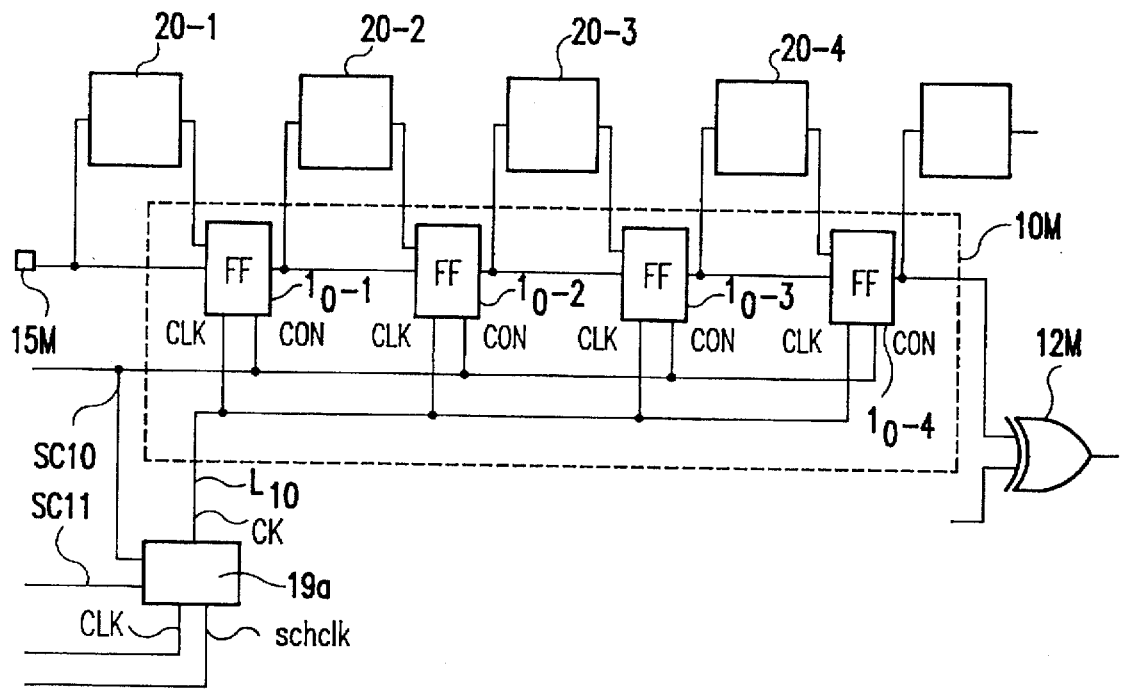
FIG. 2 is a circuit diagram illustrating peripheral circuits of a scan path 10M (M=1, 2, . . . m) shown in FIG. 1.

FIG. 2 is a circuit diagram showing peripheral circuits of the scan path 10M (M=1, 2, ... m) shown in FIG. 1.

The FFs consisting of four stages in the scan path 10M are regarded as 10-1 through 10-4. A logic circuit 20-1 activated in the normal mode is provided between the terminal 15M and the FF 10-1. Similarly, logic circuits 20-2 through 20-4 are provided between the respective adjacent FFs 10-1 through 10-4, respectively.

The FF 10-1 is electrically connected to the terminal 15M and the logic circuit 20-1 so that data on the terminal 15M and data outputted from the logic circuit 20-1 are inputted to the FF 10-1. Similarly, the respective FFs 10-2 through 10-4 are electrically connected to the preceding-stage FFs 10-1 through 10-3 and the logic circuits 20-2 through 20-4 provided therebetween respectively so that data outputted from the FFs 10-1 through 10-3 and data outputted from the logic circuits 20-2 through 20-4 are inputted to the FFs 10-2 through 10-4 respectively. Namely, the FFs 10-1 through 10-4 are supplied with two data respectively. The output side of the FF 10-4 is electrically connected to the exclusive OR circuit 12M. A clock signal CK supplied from the clock selection circuit 17a through the clock signal transmission line L10 is inputted to clock terminals CLK of the respective FFs 10-1 through 10-4.

Figure 3:
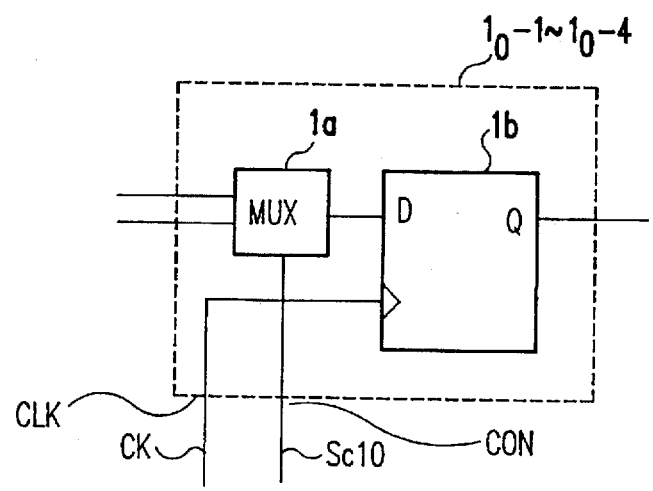
FIG. 3 is a circuit diagram showing an internal structure of each of flip-flops 10-1 through 10-4 shown in FIG. 2.

FIG. 3 is a circuit diagram showing an internal structure of each of the FFs 10-1 through 10-4 shown in FIG. 2.

Each of the FFs 10-1 through 10-4 consists of a multiplexer (MUX) 1a provided on the input side and a latch 1b. The multiplexer 1a serves so as to select the above-described two input data, based on a control signal Sc10. The latch 1b latches the data selected by the multiplexer 1a therein in synchronism with the clock signal CK supplied from the clock selection circuit 17a. When, for example, the control signal Sc10 is "0" and the normal mode is specified, the multiplexers 1a in the respective FFs 10-1 through 10-4 select data outputted from the logic circuits 20-1 through 20-4, respectively. Thus, the FFs 10-1 through 10-4 take electrical connections corresponding to the normal mode and serve so as to store therein the data outputted from the respective logic circuits 20-1 through 20-4.

When the control signal Sc10 results in "1" and the test mode is specified, the multiplexer 1a in the FF 10-1 selects the data on the terminal 15M. Similarly, the multiplexers 1a in the respective FFs 10-2 through 10-4 select the data stored in the preceding-stage FFs 10-1 through 10-3, respectively. Thus, the scan path 10M composed of the FFs 10-1 through 10-4 results in the connections corresponding to the test mode and is hence able to function as a shift register.

On the other hand, the clock signal CK to be supplied to the clock terminals CLK of the FFs 10-1 through 10-4 is supplied from the clock selection circuit 17a. The clock selection circuit 17a is supplied with control signals Sc10 and Sc11 and two types of clock signals clk and schclk. The clock selection circuit 17a has the function of selecting either the clock signal clk or the signal schclk according to a combination of levels of the control signals Sc10 and Sc11 and outputting it as the clock signal CK. The clock signal clk is a timing signal used for controlling the FFs 10-1 through 10-4 when they store therein expected values to be described later or output the stored data therefrom in the normal operation mode or test mode. The clock signal schclk is fixed to a high potential level, for example. The clock signal schclk is prepared to retain the data stored in the FFs 10-1 through 10-4 in the scan path 10M when the scan path 11M paired up with the scan path 10M stores the expected values therein. The clock signal schclk serves so as to prohibit shift operations of the FFs 10-1 through 10-4.

When the respective control signals Sc10 and Sc11 are both "0", the control signal Sc10 is "1" and the control signal Sc11 is "0", and the respective control signals Sc10 and Sc11 are both "1", the clock selection circuit 17a selects the signal clk as the clock signal CK and outputs it therefrom. Further, when the control signal Sc10 is "0" and the control signal Sc11 is "1", the clock selection circuit 17a selects the signal schclk as the clock signal CK and outputs it therefrom.

Thus, when the normal operation mode is selected and the control signals Sc10 and Sc11 are both brought to "0", the FFs 10-1 through 10-4 respectively store therein the data outputted from the logic circuits 20-1 through 20-4 respectively in synchronism with the clock signal CK (clock signal clk). Since the FFs 10-1 through 10-4 are subjected to control over their operations, based on the signal schclk to carry out a test when the control signal Sc10 is set to "0" and the control signal Sc11 is set to "1", the data stored in the FFs 10-1 through 10-4 are held as they are. Reversely when the control signal Sc10 is "1" and the control signal Sc11 is "0", a shift register is constructed of the FFs 10-1 through 10-4 and the expected value supplied from the terminal 15M is shifted based on the clock signal clk given as the clock signal CK so as to be stored in the FFs 10-1 through 10-4. Thereafter, when the control signals Sc10 and Sc11 are both set to "1", the shift register constructed of the FFs 10-1 through 10-4 can output the expected values stored in the FFs 10-1 through 10-4, based on the clock CK i.e., the clock signal clk. Namely, the normal mode operation and the test mode operation can be easily set by performing switching therebetween with the two control signals Sc10 and Sc11.

Figure 4:
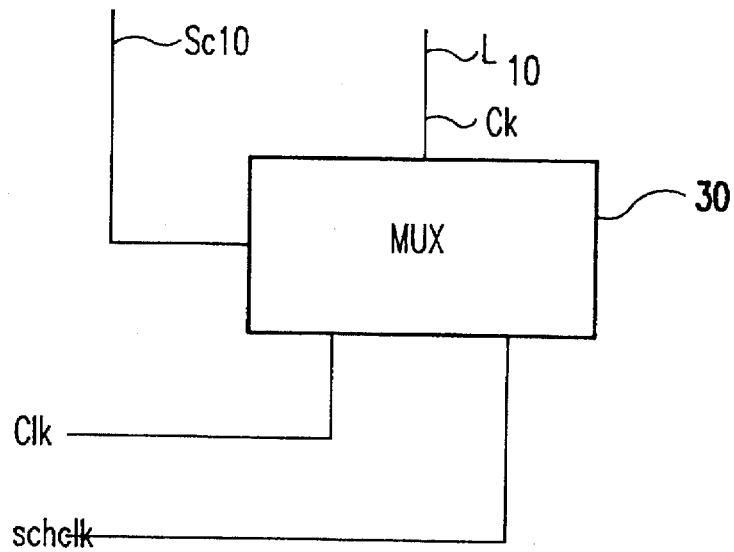
FIG. 4 is a diagram showing another configuration example (No. 1) of a clock selection circuit 17a shown in FIG. 2.
Figure 5:
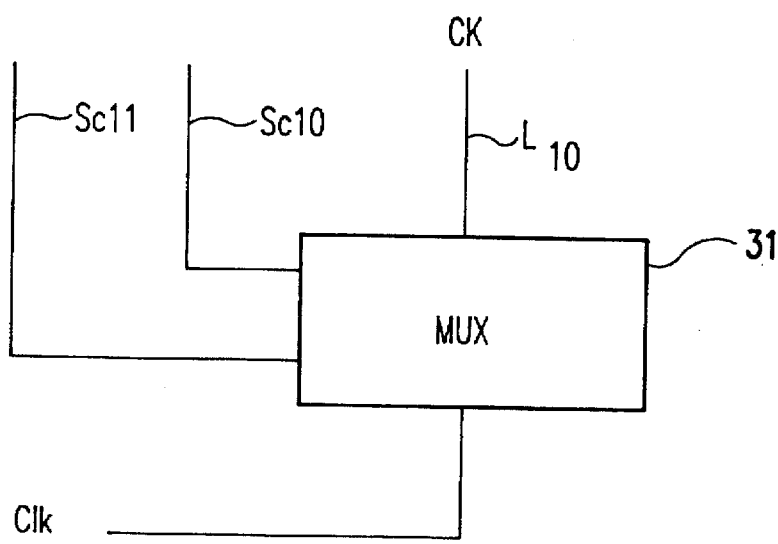
FIG. 5 is a diagram depicting a further configuration example (No. 2) of the clock selection circuit 17a shown in FIG. 2.

FIGS. 4 and 5 are respectively diagrams showing other configuration examples (Nos. 1 and 2) of the clock selection circuit 17a shown in FIG. 2.

The clock selection circuit 17a can be also composed of a multiplexer 30 shown in FIG. 4. The multiplexer 30 has the function of selecting a clock signal clk as a clock signal CK when a control signal Sc10 is "0", selecting a signal schclk as the clock signal CK when the control signal Sc10 is "1", and outputting the clock signal CK from a clock signal transmission line L10. When the clock selection circuit 17a is constructed of the multiplexer 30, the input states of the signals clk and schclk inputted from the outside are set as follows: Upon the normal operation mode, the clock clk is first set so as to repeatedly rise and fall in a predetermined cycle in a manner similar to the normal clock signal. Since the signal schclk is not selected by the multiplexer 30, it may be set to any state. When the control signal Sc10 is "0" and the control signal Sc11 is "1" in the test mode, the potential of the clock signal clk is fixed to a high or low level potential. Thus, the respective FFs 10-1 through 10-4 do not operate. Namely, the FFs 10-1 through 10-4 do not store new data. Even in this case, the signal schclk may be kept in any state. On the other hand, when the control signal Sc10 is "1", the signal schclk is set so as to repeatedly rise and fall in a predetermined cycle even if the control signal Sc11 is "0" or "1". Since the clock signal clk is not selected by the multiplexer 30, it may be kept in any state.

As shown in FIG. 4, the use of the multiplexer 30 in place of the clock selection circuit 17a shown in FIG. 2 can eliminate the need for the function for determining a choice between the signals clk and schclk according to the combination of the control signals Sc10 and Sc11 and makes it possible to simplify a circuit configuration and provide the speeding up of a circuit operation. Namely, a size reduction in the entire device and the speeding up of a processing operation can be expected.

The clock selection circuit 17a may be constructed of a clock control circuit 31 shown in FIG. 5. The clock control circuit 31 controls the level of a clock signal clk according to a combination of a control signal Sc10 and a control signal Sc11 and outputs the clock signal clk as a clock signal CK. When the clock selection circuit 17a is constructed of the clock control circuit 31, the clock signal clk may be such a normal one as to repeatedly rise and fall in a predetermined cycle. The combination of the control signal Sc10 and the control signal Sc11 is similar to the case where the clock selection circuit 17a shown in FIG. 2 is used. When the respective control signals Sc10 and Sc11 are both "0", the control signal Sc10 is "1" and the control signal Sc11 is "0", and the respective control signals Sc10 and Sc11 are both "1", the clock signal clk is outputted as the clock signal CK as it is. On the other hand, when the control signal Sc10 is "0" and the control signal Sc11 is "1", the clock signal clk is fixed to a potential of a high or low level and is outputted from the clock control circuit 31 as the clock signal CK. Namely, the same operation as that illustrated in FIG. 2 can be implemented. Thus, when the clock selection circuit is constructed of the clock control circuit 31 shown in FIG. 5 as an alternative to the clock selection circuit 17a, the signal schclk becomes unnecessary.

Peripheral circuits of the scan path 11M will next be described.

Figure 6:
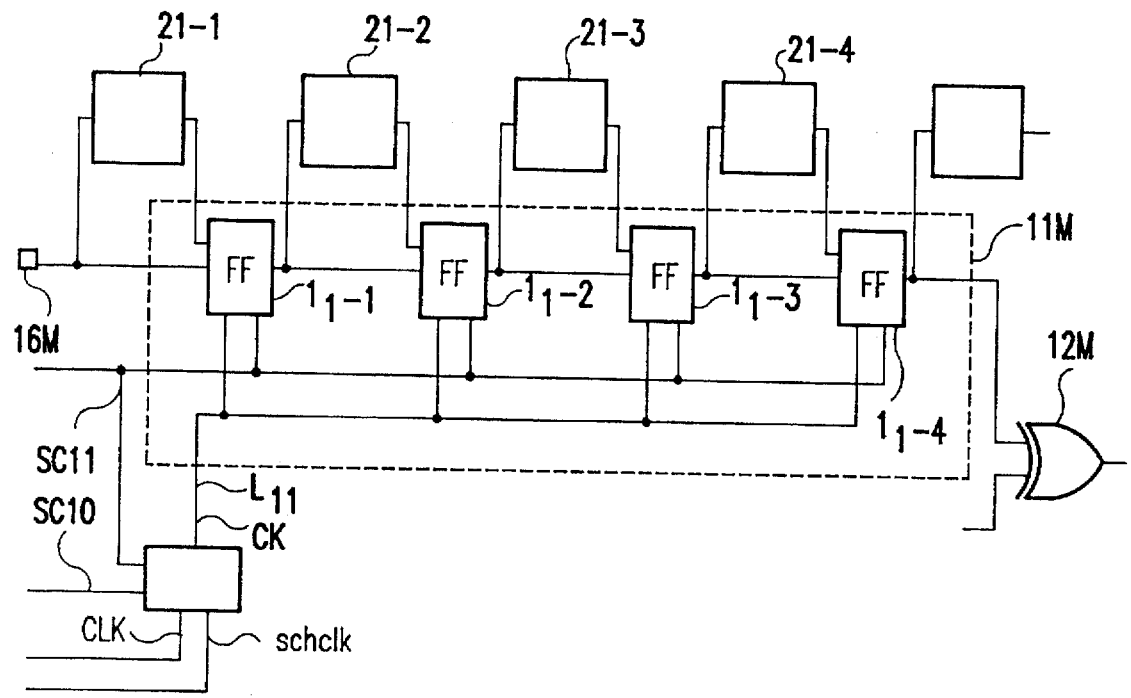
FIG. 6 is a circuit diagram showing structures of peripheral circuits of a scan path 11M shown in FIG. 1.

FIG. 6 is a circuit diagram showing configurations of the peripheral circuits of the scan path 11M shown in FIG. 1.

The FFs consisting of the four stages in the scan path 10M are regarded as 11-1 through 11-4. A logic circuit 21-1 activated in the normal mode is provided between a terminal 16M and the FF 11-1 in a manner similar to FIG. 2. Further, logic circuits 21-2 through 21-4 are provided between the respective adjacent FFs 11-1 through 11-4, respectively.

The FF 11-1 is supplied with data on the terminal 16M and data outputted from the logic circuit 21-1. Similarly, the respective FFs 11-2 through 11-4 are respectively supplied with data outputted from the preceding-stage FFs 11-1 through 11-3 and data outputted from the logic circuits 21-2 through 21-4 provided between the FFs 11-1 through 11-4. Namely, the FFs 11-1 through 11-4 are supplied with the two data respectively. The output of the FF 11-4 is electrically connected to the exclusive OR circuit 12M. As distinct from FIG. 2, a clock signal CK supplied from a clock selection circuit 17b through a clock signal transmission line L11 is inputted to clock terminals CLK of the respective FFs 11-1 through 11-4.

Figure 7:
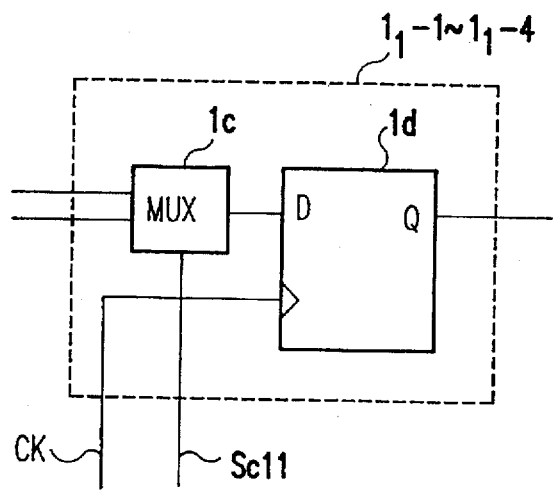
FIG. 7 is a circuit diagram illustrating an internal structure of each of flip-flops 11-1 through 11-4 shown in FIG. 6.

FIG. 7 is a circuit diagram showing an internal structure of each of the FFs 11-1 through 11-4 shown in FIG. 6.

Each of the FFs 11-1 through 11-4 consists of a multiplexer (MUX) 1c provided on the input side and a latch 1d. The multiplexer 1c selects the two input data, based on a control signal Sc11. The latch 1d latches data selected by the multiplexer 1c therein in synchronism with the clock signal CK supplied from the clock selection circuit 17b. When the control signal Sc11 is "0" and the normal mode is specified, the multiplexers 1c in the respective FFs 11-1 through 11-4 select data outputted from the logic circuits 21-1 through 21-4 respectively. Thus, the FFs 11-1 through 11-4 take electrical connections corresponding to the normal mode and serve so as to store therein the data outputted from the respective logic circuits 21-1 through 21-4.

When the control signal Sc11 results in "1" and the test mode is specified, the multiplexer 1c in the FF 11-1 selects the data on the terminal 16M. Similarly, the multiplexers 1c in the respective FFs 11-2 through 11-4 select the data stored in the preceding-stage FFs 11-1 through 11-3, respectively. Thus, the scan path 11M composed of the FFs 11-1 through 11-4 results in electrical connections corresponding to the test mode and is hence capable of serving as a shift register.

On the other hand, the clock signal CK to be supplied to the clock terminals of the FFs 11-1 through 11-4 is supplied from the clock selection circuit 17b. The clock selection circuit 17b is supplied with control signals Sc10 and Sc11 and two types of signals clk and schclk. The clock selection circuit 17b has the function of selecting either the clock signal clk or the signal schclk according to a combination of levels of the control signals Sc10 and Sc11 and outputting it as the clock signal CK.

When the respective control signals Sc10 and Sc11 are both "0", the control signal Sc10 is "0" and the control signal Sc11 is "1", and the respective control signals Sc10 and Sc11 are both "1", the clock selection circuit 17b selects the signal clk as the clock signal CK and outputs it therefrom. Further, when the control signal Sc10 is "1" and the control signal Sc11 is "0", the clock selection circuit 17b selects the signal schclk as the clock signal CK and outputs it therefrom.

Thus, when the normal operation mode is selected and the control signals Sc10 and Sc11 are both brought to "0", the FFs 11-1 through 11-4 store therein the data outputted from the logic circuits 21-1 through 21-4 in synchronism with the clock signal CK corresponding to the clock signal clk, respectively. Since the FFs 11-1 through 11-4 are subjected to control over their operations, based on the signal schclk to carry out a test when the control signal Sc10 is set to "1" and the control signal Sc11 is set to "0", the data stored in the FFs 11-1 through 11-4 are retained as they are. Reversely when the control signal Sc10 is "0" and the control signal Sc11 is "1", a shift register is constructed of the FFs 11-1 through 11-4 and the expected value supplied from the terminal 16M is shifted based on the clock signal clk given as the clock signal CK so as to be stored in the FFs 11-1 through 11-4. Thereafter, when the control signals Sc10 and Sc11 are both set to "1", the shift register constructed of the FFs 11-1 through 11-4 can output the expected values stored in the FFs 11-1 through 11-4, based on the clock CK, i.e., the clock signal clk. Namely, the normal mode operation and the test mode operation can be easily set by performing switching therebetween with the two control signals Sc10 and Sc11 in a manner similar to FIG. 2.

In a manner similar to the clock selection circuit 17a, the clock selection circuit 17b can be also composed of a multiplexer using the control signal Sc11 as a selection signal, or a clock control circuit for performing level control with the levels of the control signals Sc10 and Sc11. When the clock selection circuit 17b is constructed of the multiplexer, the input states of the signals clk and schclk inputted from the outside are set as follows:

Upon the normal operation mode, the clock clk is first set so as to repeatedly rise and fall in a predetermined cycle in a manner similar to the normal clock signal. Since the signal schclk is not selected by the multiplexer 30, it may be set to any state. When the control signal Sc10 is "1" and the control signal Sc11 is "0" in the test mode, the clock signal clk is fixed to a potential of a high or low level. Thus, the respective FFs 11-1 through 11-4 do not operate. Namely, the FFs 11-1 through 11-4 do not store new data therein. Even in this case, the signal schclk may be kept in any state. On the other hand, when the control signal Sc11 is "1", the signal schclk is set so as to repeatedly rise and fall in a predetermined cycle even if the control signal Sc10 is "0" or "1". Since the clock signal clk is not selected by the multiplexer, it may be kept in any state.

When the clock selection circuit 17b is constructed of the clock control circuit shown in FIG. 5 in place of the clock selection circuit 17b, the clock control circuit controls the level of a clock signal clk according to a combination of a control signal Sc10 and a control signal Sc11 and outputs the clock signal clk as a clock signal CK. In this case, the clock signal clk may be such a normal one as to repeatedly rise and fall in a predetermined cycle. The combination of the control signal Sc10 and the control signal Sc11 is similar to the case where the clock selection circuit 17b is used. When the respective control signals Sc10 and Sc11 are both "0", the control signal Sc10 is "0" and the control signal Sc11 is "1", and the respective control signals Sc10 and Sc11 are both "1", the clock signal clk is outputted as the clock signal CK as it is. On the other hand, when the control signal Sc11 is "0" and the control signal Sc10 is "1", the clock signal clk is fixed to a potential of a high or low level and is outputted from the clock control circuit as the clock signal CK.

Figure 9:
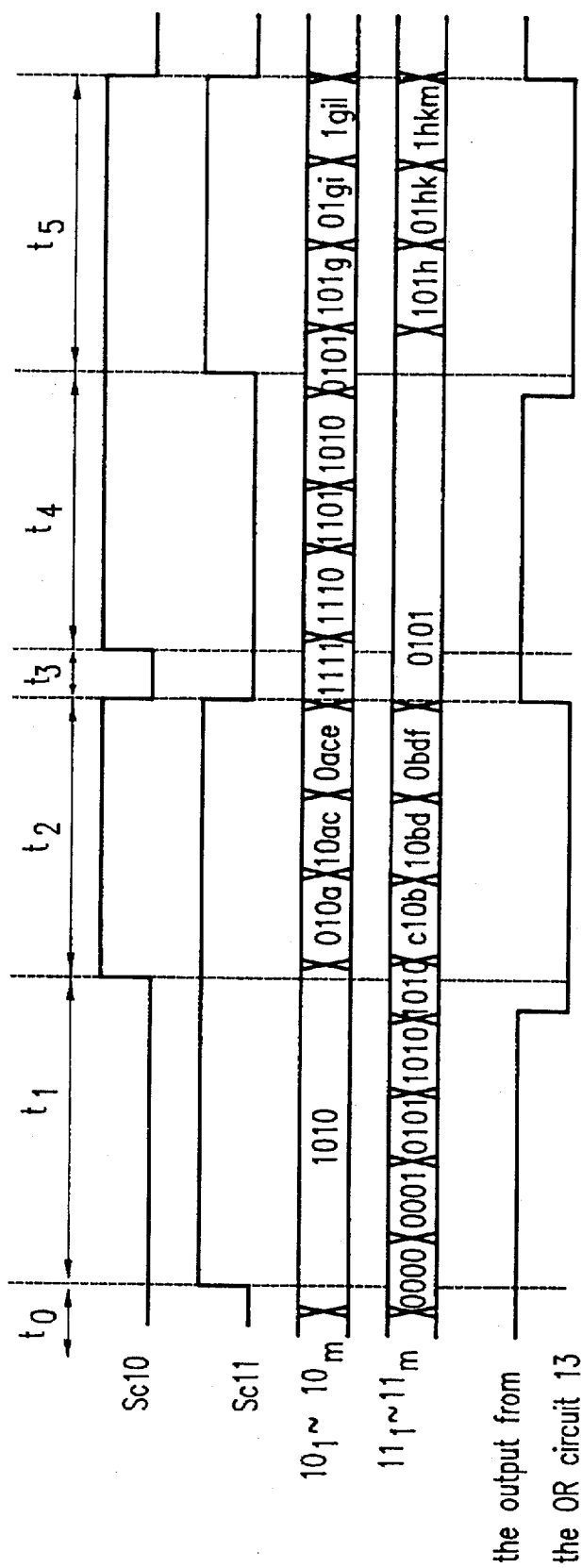
FIG. 9 is a timing chart for describing the scan test method shown in FIG. 1.

FIG. 8 is a diagram showing the signals Sc10 and Sc11 shown in FIG. 1. FIG. 9 is a timing chart for carrying out the scan test method shown in FIG. 1. The scan test method employed in the first embodiment will be described with reference to FIGS. 8 and 9.

The control signals Sc10 and Sc11 are first set to "0" respectively and the semiconductor integrated circuit is activated through electrical connections corresponding to a normal mode (a period t0 in FIG. 9). As a result, data is latched in each FF1.

Next, the control signal Sc10 is set to "0" and the control signal Sc11 is set to "1". In doing so, the scan paths 111 through 11m are activated so as to be ready for operating as a shift register (enter into an "enable" state in FIG. 8). At this time, the scan paths 101 through 10m are inactive (disabled in FIG. 8) and are set to a state of being non-functional as a shift register. After the control signal Sc10 and the signal Sc11 have been set to "0" and "1" respectively, the scan paths 111 through 11m scan in the expected values corresponding to the data latched in the FFs 1 of the respective scan paths 101 through 10m from the terminals 161 through 16m, respectively. At this time, the FFs 1 (10-1 through 10-4) in the scan paths 101 through 10m are respectively supplied with the signal schclk as the clock signal CK, whereas the FFs 1 (11-1 through 11-4) in the scan paths 111 through 11m are respectively supplied with the clock signal clk. In this condition, the expected value are inputted from the respective terminals 161 through 16m to allow the scan paths 111 through 11m to perform shift operations synchronized with the clock signal clk, whereby the expected values are written into and stored in their corresponding FFs 11-1 through 11-4. This is a first writing process (a period t1 in FIG. 9). If the expected values of the four series-connected FFs are represented as "1010", for example, then the expected values are written into their corresponding FFs under four-clock shift operations as shown in FIG. 9. The FFs 1 (10-1 through 10-4) in the scan paths 101 through 10m supplied with the signal schclk as the clock signal CK retain the stored data as they are.

When the writing of the expected values into the FFs has been completed, the control signal Sc10 is set to "1" and the scan paths 101 through 10m are also set so as to be ready for operating as a shift register. Both the scan paths 101 through 10m and the scan paths 111 through 11m are shift-operated by four clocks respectively. As a result, the data latched in the four-stage FFs 1 in the respective scan paths 101 through 10m and the expected value corresponding to the data are outputted in parallel so as to be supplied to their corresponding exclusive OR circuits 121 through 12m. If the data latched in the four-stage FFs 1 in the individual scan paths 101 through 10m coincide with their corresponding expected values respectively, then the respective exclusive OR circuits 121 through 12m output "0" as a comparison result and the OR circuit 13 outputs "0" as a decision result during periods of the four clocks. The above-described processing is called a "first determining process" (a period t2 in FIG. 9).

After the first determining process, the semiconductor integrated circuit is first activated in the normal mode. Further, a second writing process and a second determining process are performed in order.

The control signals Sc10 and Sc11 are first both set to "0" and the semiconductor integrated circuit is activated through the connections corresponding to the normal mode (a period t3 in FIG. 9). As a result, data are latched in the FFs 1 respectively. Next, the control signal Sc10 is set to "1" and the control signal Sc11 is set to "0". In doing so, the scan paths 101 through 10m are activated so as to be ready for operating as a shift register. At this time, the scan paths 111 through 11m are inactive and thereby set to a state of being in working as a shift register.

Upon the second writing process (a period t4 in FIG. 9), the control signal Sc11 is set to "0" and the signal Sc10 is set to "1". At this time, the FFs 1 (10-1 through 10-4) in the scan paths 101 through 10m are respectively supplied with the clock signal clk as the clock signal CK. The FFs 1 (11-1 through 11-4) in the scan paths 111 through 11m are supplied with the signal schclk, respectively. In this condition, the scan paths 101 through 10m scan in the expected values corresponding to the data latched in the FFs 1 in the respective scan paths 111 through 11m from the respective terminals 151 through 15m, respectively. Namely, the scan paths 101 through 10m are shift-operated in synchronism with the clock signal clk used as the clock signal CK so as to write the expected values into the FFs 1. If the expected values of the four series-connected FFs are represented as "0101", for example, then the expected values are written into their corresponding FFs under four-clock shift operations as shown in FIG. 9. The FFs 1 (11-1 through 11-4) in the scan paths 111 through 11m supplied with the signal schclk as the clock signal CK retain the stored data as they are.

When the writing of the expected values into the FFs has been completed, the control signal Sc10 is set to "1" and the scan paths 101 through 10m are also set so as to be ready for operating as a shift register upon the second determining process (a period t5 in FIG. 9). Both the scan paths 101 through 10m and the scan paths 111 through 11m are shift-operated by four clocks respectively. As a result, the data latched in the four-stage FFs 1 in the respective scan paths 111 through 11m and the expected values corresponding to the data are successively outputted in parallel so as to be supplied to their corresponding exclusive OR circuits 121 through 12m. If the data latched in the four-stage FFs 1 in the individual scan paths 111 through 11m coincide with their corresponding expected values respectively, then the respective exclusive OR circuits 121 through 12m output "0" as a comparison result and the OR circuit 13 outputs "0" as a decision result during periods of the four clocks.

When the semiconductor integrated circuit works normally, the data are latched in the respective FFs 1 as predicted as the expected values. Therefore, "0" is continuously outputted through the first determining process and the second determining process. It is thus finally determined whether or not the semiconductor integrated circuit has worked normally.

In the first embodiment as described above, one of the scan path pair scans in the expected-value data stored in the other thereof. Thereafter, both the scan paths 101 through 10m and 111 through 11m are shift-operated to allow the exclusive OR circuits 121 through 12m to compare the expected values and the latched data, whereby the result of determination is outputted from the OR circuit 13. Thus, the expected value corresponding to the result of determination results in "0" alone, so that a failure in the semiconductor integrated circuit can be easily confirmed. Further, the time and efforts to calculate the expected value for the output as in the conventional reference can be eliminated.

Second Embodiment

Figure 10:
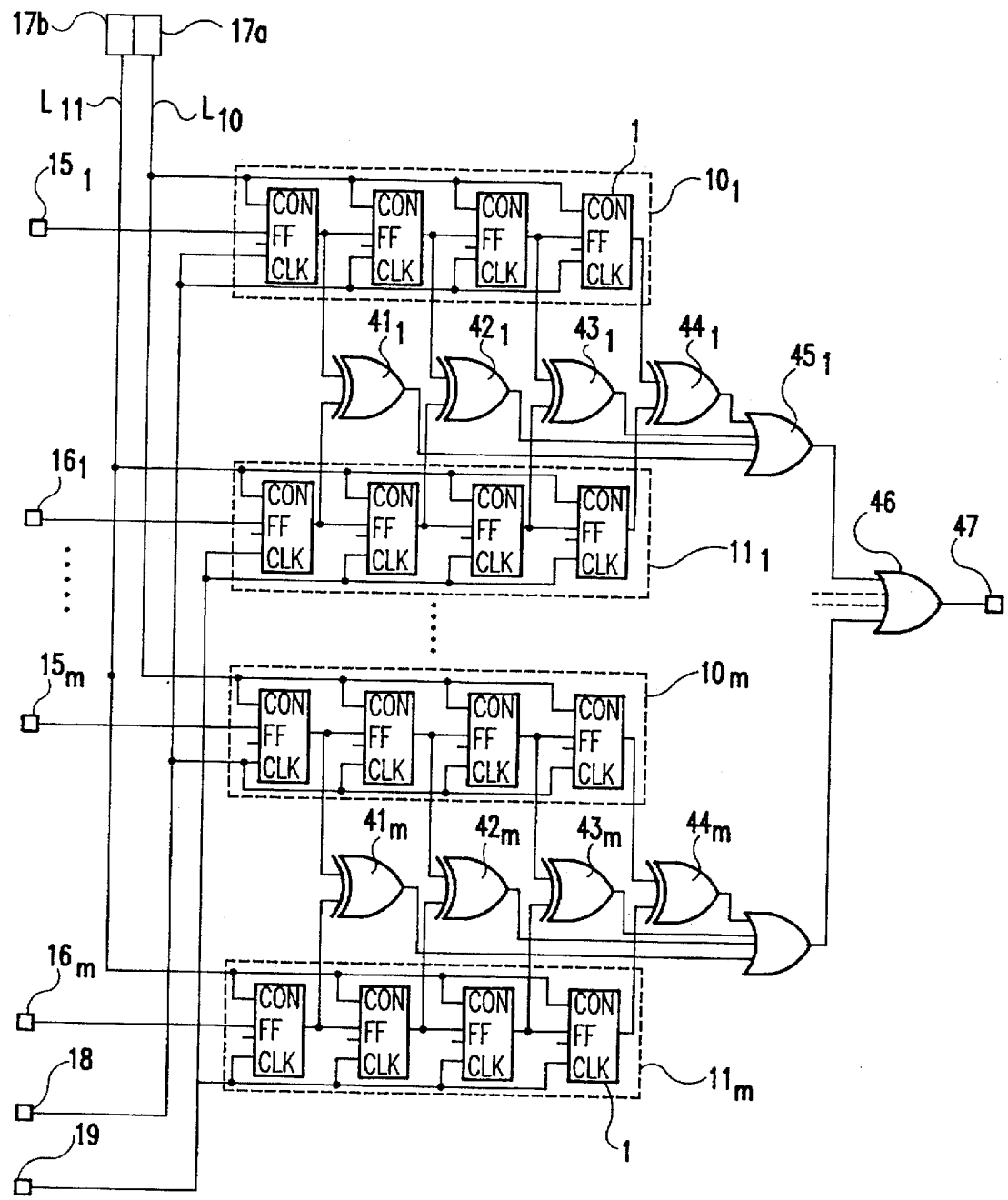
FIG. 10 is a circuit diagram illustrating test mode connections to flip-flops employed in a scan test method, of a semiconductor integrated circuit according to a second embodiment of the present invention.

FIG. 10 is a circuit diagram showing test mode connections to flip-flops employed in a scan test method, of a semiconductor integrated circuit according to a second embodiment of the present invention. Elements of structure common to those shown in FIG. 1 are identified by common reference numerals.

A plurality of flip-flops (hereinafter called "FFs") 1 included in the semiconductor integrated circuit are connected so as to correspond to a normal mode in order to perform the original operation as an integrated circuit upon a normal mode operation. In a test mode for testing the semiconductor integrated circuit, the FFs 1 can be set to connections corresponding to the test mode as illustrated in FIG. 10.

Peripheral circuits of the FFs 1 are similar to those employed in the first embodiment. In the connections corresponding to the test mode, the FFs 1 are series-connected to each other in four stages to form m first scan paths 101 through 10m, and the FFs 1 are series-connected to one another in four stages to form m second scan paths 111 through 11m. The respective scan paths 101 through 10m and scan paths 111 through 11m form m pairs of scan path pairs.

As distinct from FIG. 1, exclusive OR circuits 411 through 41m used as comparing means are electrically connected to the output sides of FFs 1 at first stages in the respective paired scan paths 101 through 10m and scan paths 111 through 11m, respectively. Exclusive OR circuits 421 through 42m are electrically connected to the output sides of FFs 1 at second stages in the respective paired scan paths 101 through 10m and scan paths 111 through 11m, respectively. Exclusive OR circuits 431 through 43m are electrically connected to the output sides of FFs 1 at third stages in the respective paired scan paths 101 through 10m and scan paths 111 through 11m, respectively. The exclusive OR circuits 431 through 43m are electrically connected to the output sides of FFs 1 at final stages in the respective paired scan paths 101 through 10m and scan paths 111 through 11m, respectively. Namely, the exclusive OR circuits corresponding to the four comparing means are provided between the first and second scan paths in the respective scan path pairs, respectively.

An OR circuit 451 is electrically connected to the output sides of the respective exclusive OR circuits 411 through 441. Similarly, OR circuits 45i are electrically connected to the output sides of the respective exclusive OR circuits 41i through 44i (i=2 to m), respectively. An OR circuit 46 is electrically connected to the output sides of the respective OR circuits 451 through 45m. The output side of the OR circuit 46 is electrically connected to an output terminal 47.

Similarly to the first embodiment, a plurality of terminals 151 through 15m are electrically connected to data terminals of the FFs 1 corresponding to the first or initial stages of the respective scan paths 101 through 10m, respectively. Further, a plurality of terminals 161 through 16m are electrically connected to data terminals of the FFs 1 corresponding to the first stages of the respective scan paths 111 through 11m, respectively. A clock signal CK is commonly supplied to clock terminals CLK of FFs 1 consisting of four stages of the respective scan paths 101 through 10m from a clock selection circuit 17a through a clock signal transmission line L10. A control signal Sc10 supplied from a terminal 18 is commonly supplied to control terminals CON of the FFs 1 consisting of the four stages of the respective scan paths 101 through 10m. On the other hand, a clock signal CK is commonly supplied to clock terminals CLK of FFs 1 consisting of four stages of the respective scan paths 111 through 11m from a clock selection circuit 17b through a clock signal transmission line L11. A control signal Sc11 delivered from a terminal 19 is commonly supplied to control terminals CON of the FFs 1 consisting of the four stages of the respective scan paths 111 through 11m. Incidentally, the clock selection circuits 17a and 17b are similar to those employed in the first embodiment. Further, each of the clock selection circuits 17a and 17b selects either one of signals clk and schclk supplied from the outside and output it as the clock signal CK.

Figure 11:
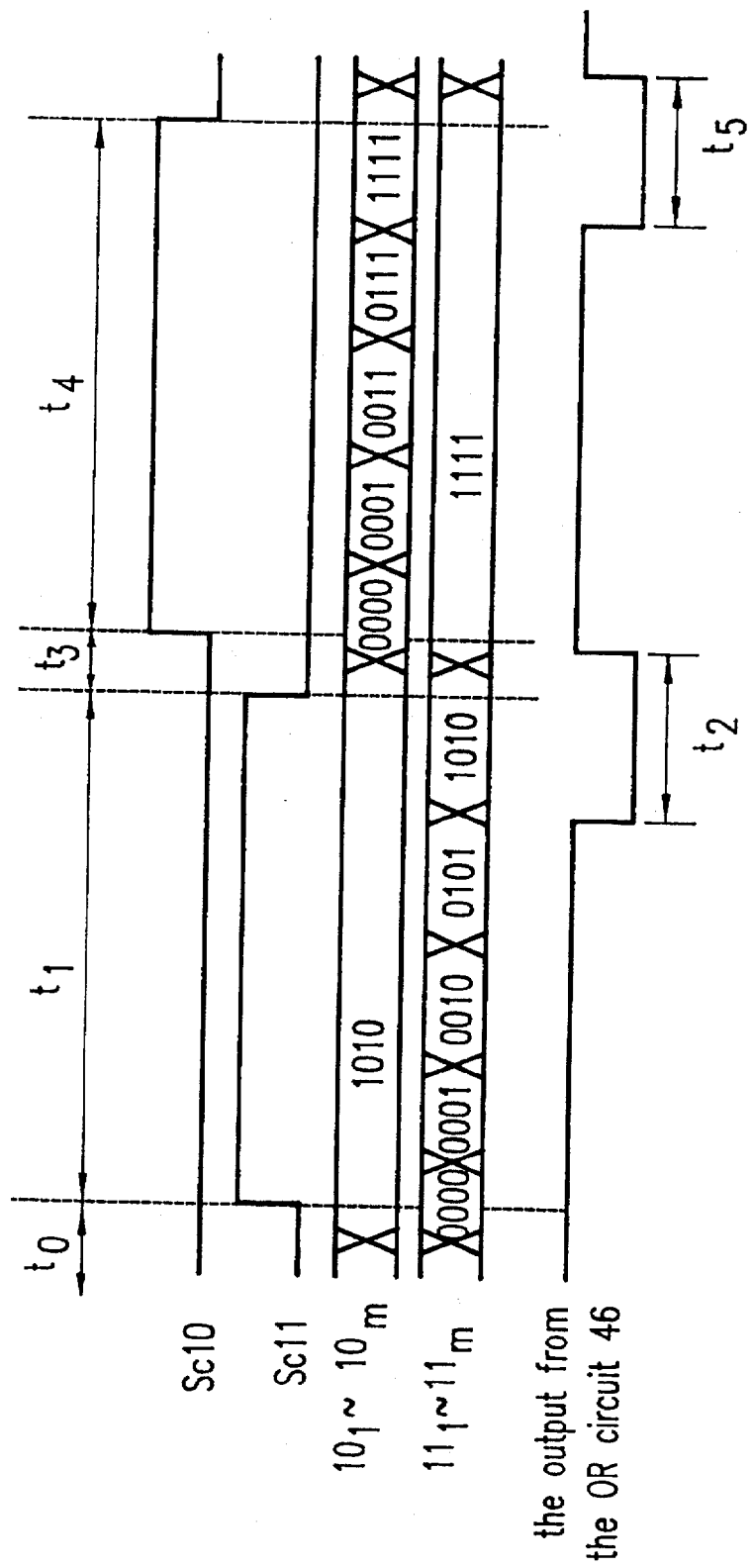
FIG. 11 is a timing chart for describing the scan test method shown in FIG. 10.

FIG. 11 is a timing chart for performing the scan test method shown in FIG. 10. The scan test method employed in the second embodiment will be described with reference to FIG. 11.

The control signals Sc10 and Sc11 are first set to "0" respectively and the semiconductor integrated circuit is activated through connections corresponding to a normal mode (a period t0 in FIG. 11) to latch data in each FF 1. Next, the control signal Sc10 is set to "0" and the control signal Sc11 is set to "1". In doing so, the scan paths 111 through 11m are activated and the scan paths 101 through 10m are deactivated. After the control signal Sc10 and the signal Sc11 have been set to "0" and "1" respectively, the scan paths 111 through 11m scan in expected values corresponding to the data latched in the FFs 1 of the respective scan paths 101 through 10m from the terminals 161 through 16m respectively. At this time, the FFs 1 in the scan paths 101 through 10m are respectively supplied with the signal schclk as the clock signal CK, whereas the FFs 1 in the scan paths 111 through 11m are respectively supplied with the clock signal clk. In this condition, the expected value are inputted from the respective terminals 16l through 16m to allow the scan paths 111 through 11m to perform shift operations synchronized with the clock signal clk, whereby the expected values are written into and stored in their corresponding FFs 11-1 through 11-4. This is a first writing process (a period t1 in FIG. 11).

If the expected values of the four series-connected FFs are represented as "1010", for example, then the expected values are written into their corresponding FFs under four-clock shift operations as shown in FIG. 11. The FFs 1 in the scan paths 101 through 10m supplied with the signal schclk as the clock signal CK retain the stored data as they are.

A first determining process(a period t2 in FIG. 11) is executed in a state in which the first writing process has been carried out. Namely, when the first writing process has bee completed, the FFs 1 at the respective stages of the scan paths 101 through 10m output the latched data respectively and the FFs 1 at the respective stages of the scan paths 111 through 11m output the expected values respectively. The respective exclusive OR circuits 411 through 41m, 421 through 42m, 431 through 43m and 441 through 44m compare these latched data and the respective expected values corresponding to the respective latched data respectively. The OR circuits 451 through 45m and the OR circuit 46 OR the respective results of comparisons respectively. Thus, the OR circuit 46 outputs a decision result indicative of whether or not the semiconductor integrated circuit works normally. When all the latched data outputted from the FFs 1 at the respective stages of the scan paths 101 through 10m have coincided with the expected values, a decision result indicative of "0" is obtained.

After the first determining process, the semiconductor integrated circuit is first activated in the normal mode (a period t3 in FIG. 11). Further, a second writing process and a second determining process are performed. Namely, the control signals Sc10 and Sc11 are both set to "0" and the semiconductor integrated circuit is activated through the connections corresponding to the normal mode. As a result, data are latched in the FFs 1 respectively. Next, the control signal Sc10 is set to "1" and the control signal Sc11 is set to "0". In doing so, the scan paths 101 through 10m are activated and the scan paths 111 through 11m are set inactive.

Upon the second writing process (a period t4 in FIG. 11), the control signal Sc11 is set to "0" and the signal Sc10 is set to "1". Thereafter, the scan paths 101 through 10m scan in the expected values corresponding to the data latched in the FFs 1 in the respective scan paths 111 through 11m from the respective terminals 151 through 15m respectively. At this time, the FFs 1 in the scan paths 101 through 10m are supplied with the clock signal clk as the clock signal CK, whereas the FFs 1 in the scan paths 111 through 11m are supplied with the signal schclk. In this condition, the scan paths 101 through 10m scan in the expected values corresponding to the data latched in the FFs 1 in the respective scan paths 111 through 11m from the respective terminals 151 through 15m respectively. Namely, the scan paths 101 through 10m are shift-operated in synchronism with the clock signal clk given as the clock signal CK to write the expected values into the FFs 1. In other words, the respective scan paths 101 through 10m are shift-operated in synchronism with the clock CK to write the expected values into the FFs 1. If the expected values of the four series-connected FFs are represented as "1111", for example, then the expected values are written into their corresponding FFs under four-clock shift operations as shown in FIG. 11.

The second determining process (a period t5 in FIG. 1) is executed in a state in which the second writing process has been carried out. Namely, when the second writing process has bee completed, the FFs 1 at the respective stages of the scan paths 111 through 11m output the latched data respectively and the FFs 1 at the respective stages of the scan paths 101 through 10m output the expected values respectively. The respective exclusive OR circuits 411 through 41m, 421 through 42m, 431 through 43m and 441 through 44m compare these latched data and the respective expected values corresponding to the respective latched data respectively. The OR circuits 451 through 45m and the OR circuit 46 OR the respective results of comparisons respectively. Thus, the OR circuit 46 outputs a decision result indicative of whether or not the semiconductor integrated circuit works normally. When all the latched data outputted from the FFs 1 at the respective stages of the scan paths 111 through 11m have coincided with the expected values, a decision result indicative of "0" is obtained.

In the second embodiment as described above, one of the scan path pair scans in the expected-value data stored in the other thereof. Thereafter, the data outputted from both the scan paths 101 through 10m and 111 through 11m are simultaneously compared. Therefore, the first writing process and the first determining process which have required eight clocks in the first embodiment, for example, can be achieved by four clocks corresponding to one-half the eight clocks. Namely, the entire processing time required for the scan test can be shortened.

Incidentally, the present invention is not necessarily limited to the above-described embodiments. Various modifications can be made. For example, the following are considered as the modifications.

(a) Although the second writing process and the second determining process are executed immediately after the cycle of the first writing process and first determining process in the above-described embodiments, the second writing process and the second determining process may be carried out plural times after the cycle of the first writing process and first determining process has been conducted plural times.

(b) Although the lengths of both the scan paths 101 through 10m and 111 through 11m are set to the length in which the FFs 1 are connected in the four stages, it is needless to say that the number of stages is not necessarily limited to four.

(c) The comparing means is not necessarily limited to the exclusive OR circuits 121 through 12m, 411 through 41m, 421 through 42m, 431 through 43m and 441 through 44m. Further, the logic means is not necessarily limited to the configurations of the OR circuits 13, 451 through 45m and 46. For example, the OR circuits 451 through 45m and 46 may be collectively configured as a single OR circuit.

According to a first invention, as has been described above in detail, when a test on a semiconductor integrated circuit is carried out, a scan path pair composed of a first scan path and a second scan path is formed in predetermined numbers. Further, expected values are written into one of the scan paths in accordance with a first or second writing process and latched states of the other thereof are compared with the expected values in accordance with a first or second determining process. Moreover, a logic means calculates the OR of the results of comparisons and determines whether or not the semiconductor integrated circuit works normally. Therefore, the expected values corresponding to the result of determination result in, for example, "0" alone and hence a failure in the semiconductor integrated circuit can be easily confirmed.

According to a second invention, a plurality of comparing means are respectively configured so as to compare data outputted from FFs at respective stages of a first scan path and data outputted from FFs at respective stages of a second scan path paired up with the first scan path. Further, a logic means is configured so as to determine the OR of the results of comparisons outputted from the respective comparing means. Therefore, the time required to performing each of a first determining process and a second determining process can be shortened and the overall processing time required to carry out a scan test on a semiconductor integrated circuit can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit having a plurality of flip-flops for respectively storing data transferred from corresponding logic circuits, comprising:

a plurality of data terminals for inputting data;

said plurality of flip-flops comprising a first flip-flop group responsive to a first control signal and a second flip-flop group responsive to a second control signal, said each flip-flop constituting said first flip-flop group, including, an output terminal, a first input terminal for receiving a signal from a corresponding one of said logic circuits, a second input terminal electrically connected to said output terminal of each of other flip-flops constituting said first flip-flop group, or a corresponding one of said data terminals, a selection circuit for selectively outputting a signal received at either one of said first and second input terminals in response to the first control signal, and a first latch circuit for latching the output of said selection circuit in response to a first clock signal and outputting the same from said output terminal, said respective flip-flops of said first flip-flop group constituting a plurality of first scan path circuits each responsive to the first control signal, said each first scan path circuit having a predetermined number of said flip-flops connected in series and successively transferring the data inputted from one of said data terminals to the next-stage flip-flops in response to the first clock signal, said each flip-flop constituting said second flip-flop group, including, an output terminal, a third input terminal for receiving a signal from a corresponding one of said logic circuits, a fourth input terminal electrically connected to said output terminal of each of other flip-flops constituting said second flip-flop group, or a corresponding one of said data terminals, a selection circuit for selecting either one of said third and fourth input terminals in response to the second control signal and outputting a signal received at the selected input terminal therefrom, a second latch circuit for latching the output of said selection circuit in response to a second clock signal and outputting the same from said output terminal, said respective flip-flops of said second flip-flop group constituting a plurality of second scan path circuits each responsive to the second control signal, said each second scan path circuit having a predetermined number of said flip-flops connected in series and successively transferring the data inputted from one of said data terminals to the next-stage flip-flops in response to the second clock signal;

a plurality of coincidence detection circuits for respectively detecting coincidences of outputs of said first scan path circuits and outputs of said second scan path circuits respectively corresponding to said first scan path circuits; and a logic circuit for outputting coincidence detection information corresponding to the results outputted from said plurality of coincidence detection circuits.

2. A semiconductor integrated circuit according to claim 1, wherein said first clock signal is supplied from a first clock signal output circuit and said first clock signal output circuit receives therein a timing signal whose potential level changes in a predetermined cycle and a fixed signal fixed to a predetermined potential level and selectively outputs the timing signal and the fixed signal as a first clock signal according to a combination of potential levels of the first control signal and the second control signal.

3. A semiconductor integrated circuit according to claim 1, wherein said first clock signal is supplied from a first clock signal output circuit and said first clock signal output circuit selectively generates a timing signal whose potential level varies in a predetermined cycle and a fixed signal fixed to a predetermined potential level according to a combination of potential levels of the first control signal and the second control signal and outputs the selected signal as a first clock signal.

4. A semiconductor integrated circuit according to claim 1, wherein said first clock signal is supplied from a first clock signal output circuit and said first clock signal output circuit receives therein a timing signal whose potential level changes in a predetermined cycle and a fixed signal fixed to a predetermined potential level and selectively outputs the timing signal and the fixed signal as a first clock signal according to the potential level of the first control signal.

5. A semiconductor integrated circuit according to claim 1, wherein said each coincidence detection circuit comprises an exclusive OR circuit and said logic circuit comprises an OR circuit.

6. A semiconductor integrated circuit having a plurality of flip-flops for respectively storing data transferred from corresponding logic circuits, comprising:

a plurality of data terminals for inputting data;

said plurality of flip-flops comprising a first flip-flop group responsive to a first control signal and a second flip-flop group responsive to a second control signal, said each flip-flop constituting said first flip-flop group, including, an output terminal, a first input terminal for receiving a signal from a corresponding one of said logic circuits, a second input terminal electrically connected to said output terminal of each of other flip-flops constituting said first flip-flop group, or a corresponding one of said data terminals, a selection circuit for selectively outputting a signal received at either one of said first and second input terminals in response to the first control signal, and a first latch circuit for latching the output of said selection circuit in response to a first clock signal and outputting the same from said output terminal, said respective flip-flops of said first flip-flop group constituting a plurality of first scan path circuits each responsive to the first control signal, said each first scan path circuit having a predetermined number of said flip-flops connected in series and successively transferring the data inputted from one of said data terminals to the next-stage flip-flops in response to the first clock signal, said each flip-flop constituting said second flip-flop group, including, an output terminal, a third input terminal for receiving a signal from a corresponding one of said logic circuits, a fourth input terminal electrically connected to said output terminal of each of other flip-flops constituting said second flip-flop group, or a corresponding one of said data terminals, a selection circuit for selecting either one of said third and fourth input terminals in response to the second control signal and outputting a signal at the selected input terminal therefrom, a second latch circuit for latching the output of said selection circuit in response to a second clock signal and outputting the same from said output terminal, said respective flip-flops of said second flip-flop group constituting a plurality of second scan path circuits each responsive to the first control signal, said each second scan path circuit having a predetermined number of said flip-flops connected in series and successively transferring the data inputted from one of said data terminals to the next-stage flip-flops in response to the second clock signal;

a plurality of coincidence detection circuits for respectively detecting coincidences of respective one outputs of the flip-flops constituting said first scan path circuits and respective one outputs of the flip-flops constituting said second scan path circuits, said respective one outputs respectively corresponding to said respective one outputs of the flip-flops constituting said first scan path circuits;

a plurality of first logic circuits for outputting first coincidence detection information corresponding to the results outputted from said plurality of coincidence detection circuits; and a second logic circuit for outputting second coincidence detection information corresponding to the results outputted from said plurality of first logic circuits.

7. A semiconductor integrated circuit according to claim 6, wherein said first clock signal is supplied from a first clock signal output circuit and said first clock signal output circuit receives therein a timing signal whose potential level changes in a predetermined cycle and a fixed signal fixed to a predetermined potential level and selectively outputs the timing signal and the fixed signal as a first clock signal according to a combination of potential levels of the first control signal and the second control signal.

8. A semiconductor integrated circuit according to claim 6, wherein said first clock signal is supplied from a first clock signal output circuit and said first clock signal output circuit selectively generates a timing signal whose potential level varies in a predetermined cycle and a fixed signal fixed to a predetermined potential level according to a combination of potential levels of the first control signal and the second control signal and outputs the selected signal as a first clock signal.

9. A semiconductor integrated circuit according to claim 6, wherein said first clock signal is supplied from a first clock signal output circuit and said first clock signal output circuit receives therein a timing signal whose potential level changes in a predetermined cycle and a fixed signal fixed to a predetermined potential level and selectively outputs the timing signal and the fixed signal as a first clock signal.

10. A semiconductor integrated circuit according to claim 6, wherein said each coincidence detection circuit comprises an exclusive OR circuit and said first and second logic circuits comprise OR circuits respectively.

* * * * *